US007873927B1

(12) United States Patent
Knol et al.

(10) Patent No.: US 7,873,927 B1
(45) Date of Patent: Jan. 18, 2011

(54) PARTITIONING A LARGE DESIGN ACROSS MULTIPLE DEVICES

(75) Inventors: David A. Knol, San Jose, CA (US); Abhishek Ranjan, Campbell, CA (US); Salil Ravindra Raje, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 335 days.

(21) Appl. No.: 12/062,447

(22) Filed: Apr. 3, 2008

Related U.S. Application Data

(60) Division of application No. 11/099,887, filed on Apr. 5, 2005, now Pat. No. 7,370,302, which is a continuation-in-part of application No. 10/800,042, filed on Mar. 12, 2004, now Pat. No. 7,146,595, which is a continuation-in-part of application No. 10/792,164, filed on Mar. 3, 2004, now Pat. No. 7,073,149.

(51) Int. Cl.
*G06F 17/50* (2006.01)

(52) U.S. Cl. ............... 716/7; 716/8; 716/9; 716/10; 716/11; 716/16; 716/17; 716/18

(58) Field of Classification Search ............... 716/7–11, 716/16–18
See application file for complete search history.

(56) References Cited

U.S. PATENT DOCUMENTS

| | | | |
|---|---|---|---|
| 4,918,614 A * | 4/1990 | Modarres et al. ............... 716/10 |
| 5,140,526 A | 8/1992 | McDermoth et al. |
| 5,452,228 A | 9/1995 | Arakawa et al. |
| 5,452,239 A | 9/1995 | Dai et al. |
| 5,461,576 A | 10/1995 | Tsay et al. |
| 5,499,191 A | 3/1996 | Young |
| 5,499,192 A * | 3/1996 | Knapp et al. ............... 716/17 |
| 5,513,119 A | 4/1996 | Moore et al. |
| 5,596,742 A * | 1/1997 | Agarwal et al. ............... 716/16 |
| 5,617,327 A | 4/1997 | Duncan |
| 5,634,050 A | 5/1997 | Krueger et al. |
| 5,648,913 A | 7/1997 | Bennett et al. |
| 5,659,484 A | 8/1997 | Bennett et al. |
| 5,696,693 A | 12/1997 | Aubel et al. |
| 5,784,290 A * | 7/1998 | Kung et al. ............... 716/7 |
| 5,991,523 A | 11/1999 | Williams et al. |
| 6,009,251 A | 12/1999 | Ho et al. |

(Continued)

OTHER PUBLICATIONS

U.S. Appl. No. 11/099,887, filed Apr. 5, 2005, Knol, David A. et al., entitled "Partitioning a Large Design Across Multiple Devices", Xilinx, Inc. 2100 Logic Drive, San Jose, CA 95124.

(Continued)

*Primary Examiner*—Naum B Levin
(74) *Attorney, Agent, or Firm*—Kevin T. Cuenot

(57) ABSTRACT

A method of partitioning a design across a plurality of integrated circuits can include creating a software construct for each one of the plurality of integrated circuits and assigning a plurality of instances to a selected software construct. Each of the plurality of instances can be from a different logic hierarchy. The method further can include automatically adding at least one input/output buffer and port to the selected software construct to accommodate the plurality of instances and creating nets connecting the plurality of instances and the at least one input/output buffer and port within the selected software construct.

6 Claims, 4 Drawing Sheets

U.S. PATENT DOCUMENTS

| | | | |
|---|---|---|---|
| 6,045,252 A * | 4/2000 | Pedersen | 716/7 |
| 6,145,117 A | 11/2000 | Eng | |
| 6,170,080 B1 | 1/2001 | Ginetti et al. | |
| 6,189,131 B1 | 2/2001 | Graef et al. | |
| 6,223,329 B1 | 4/2001 | Ling et al. | |
| 6,249,903 B1 * | 6/2001 | McSherry et al. | 716/11 |
| 6,317,863 B1 | 11/2001 | Segal | |
| 6,408,422 B1 | 6/2002 | Hwang et al. | |
| 6,467,074 B1 * | 10/2002 | Katsioulas et al. | 716/17 |
| 6,487,708 B1 | 11/2002 | Canaris | |
| 6,505,323 B1 | 1/2003 | Lipton et al. | |
| 6,530,070 B2 | 3/2003 | Kruse | |
| 6,618,834 B2 | 9/2003 | Takeyama et al. | |
| 6,622,291 B1 | 9/2003 | Ginetti | |
| 6,631,508 B1 | 10/2003 | Williams | |
| 6,684,376 B1 | 1/2004 | Kerzman et al. | |
| 6,711,729 B1 | 3/2004 | McElvain et al. | |
| 6,817,005 B2 | 11/2004 | Mason et al. | |
| 6,845,494 B2 | 1/2005 | Burks et al. | |
| 7,013,438 B1 | 3/2006 | Saldanha et al. | |
| 7,073,149 B2 | 7/2006 | Knol et al. | |
| 7,103,863 B2 | 9/2006 | Riepe et al. | |
| 7,117,473 B1 | 10/2006 | Knol et al. | |
| 7,120,892 B1 | 10/2006 | Knol et al. | |
| 7,146,595 B2 | 12/2006 | Knol et al. | |
| 7,168,041 B1 * | 1/2007 | Durrill et al. | 715/700 |
| 7,188,327 B2 | 3/2007 | Hahn | |
| 7,370,302 B1 * | 5/2008 | Knol et al. | 716/7 |
| 2002/0124230 A1 * | 9/2002 | Cai et al. | 716/6 |
| 2004/0078767 A1 | 4/2004 | Burks et al. | |
| 2005/0268269 A1 | 12/2005 | Coiley | |

OTHER PUBLICATIONS

U.S. Aplpl. No. 11/100,290, Ranjan et al., filed Apr. 5, 2005, entitled "Method of Memory and Run-Time Efficient Hierarchical Timing Analysis in Programmable Logic Devices", Xilinx, Inc. 2100 Logic Drive, San Jose, CA 95124.

U.S. Appl. No. 11/152,502, Knol et al., filed Jun. 14, 2005, entitled "System for Representing the Logical and Physical Information of an Integrated Circuit", 68 pgs., Xilinx, Inc. 2100 Logic Drive, San Jose, CA 95124.

Cong et al., "Buffer block planning for interconnected-driven floorplanning", Computer-Aided Design, 1999, Digest of Technical Papers, 1999 IEEE/ACM International Conference on Nov. 7-11, 1999, pp. 358-363.

Hiwatashi, T. et al., "An interactive/automatic floor planner for hierarchically designed cell bases VLSIs", Custom Integrated Circuits Conference, 1990, Proceedings of the IEEE 1990., May 13-16, 1990, pp. 30.4/1-30.4/4.

Ranjan et al., "Fast hierarchical floorplanning with congestion and timing control", Computer Design, 2000, Proceedings 2000 International Conference Sep. 17-20, 2000, pp. 357-362.

Sarkar et al., "Routability-driven repeater block planning for interconnect-centric floorplanning", Computer-Aided Design of Integrated Circuits and Systems, IEEE Transactions on vol. 20, Issue 5, May 2001, pp. 660-671.

Wang, Maogang, et al., "Multi-Million Gate FPGA Physical Design Challenges", ICCAD, Nov. 1003, pp. 891-898, available from Xilinx, Inc., 2100 Logic Drive, San Jose, CA 95124.

* cited by examiner

PARTITIONING A LARGE DESIGN ACROSS MULTIPLE DEVICES

CROSS-REFERENCE

This application is a divisional of U.S. patent Ser. No. 11/099,887 filed Apr. 5, 2005, entitled "Partitioning a Large Design Across Multiple Devices", by David A. Knol, et al., which is a continuation-in-part of U.S. Pat. No. 7,073,149, issued Jul. 4, 2006, entitled "System for Representing the Logical and Physical Information of an Integrated Circuit", by David A. Knol, et. al., which is a continuation-in-part of U.S. Pat. No. 7,146,595, issued Dec. 5, 2006, entitled "Data Structures for Representing the Logical and Physical Information of an Integrated Circuit", by David A. Knol, et. al., all of which are herein incorporated by reference in their entirety.

FIELD OF THE INVENTION

This invention relates to the field of electronic circuit design and, more particularly, to partitioning a design across a plurality of integrated circuits.

DESCRIPTION OF THE RELATED ART

Modern circuit designs commonly include integrated circuits (ICs). ICs can include programmable logic devices (PLDs), application specific integrated circuits (ASICs), and/or application specific standard products (ASSPs). A PLD, for example, is a type of integrated circuit that can be programmed to perform specified logic functions. In any case, many circuit designs have become so large that it is not possible implement the design on a single IC. In such cases, it becomes necessary to spread the design across several ICs. Designs that incorporate multiple devices can be implemented by placing the devices on one or more circuit boards, by incorporating the devices within a single die, etc.

Regardless of how the devices are interconnected, when a design incorporates multiple ICs, the design must be partitioned across the devices. Partitioning involves assigning portions of the design, i.e. logic functions and corresponding components, to each of the various devices. A design can be thought of as a collection of hierarchies of logic blocks, with top level logic blocks being composed of lower level logic blocks. Each logic hierarchy can be represented as a branch of a graph where logic blocks, also referred to as instances of logic blocks or instances, are represented by nodes. The nodes can be organized such that all branches of the graph extend from a single root node. Within each branch, child nodes depend from parent nodes. Each branch can begin at the root node and extend down multiple levels terminating at leaf nodes. The graph can include many different levels depending upon the complexity of the logic hierarchies.

In illustration, one example of a top level logic block in a design can be a microprocessor. The microprocessor can be represented by a top level node located just below the root node. The branch identified by the top level node specifies all of the components necessary to describe the microprocessor in increasing detail. The level immediately below the top level node can specify the Arithmetic Logic Units (ALUs) of the microprocessor. Each ALU is represented by a node on the level below the top level node. That is, each ALU node is a child of the top level microprocessor node. Each ALU node also can function as a parent node having child nodes representing the adders that are combined to form the ALUs. Each adder node also can have child nodes representing the individual logic gates, i.e. NAND and OR gates, used to form the adders.

Another example of a top level logic block can be an MP3 player. In that case, sub-nodes can represent components such as microprocessors, data buses, and digital signal processing blocks. Any of a variety of different systems, when viewed at a functional level, can be considered a logic hierarchy. Thus, it should be appreciated that other functions and/or systems that can be implemented in an IC can be considered a logic hierarchy.

FIG. 1 is a schematic diagram illustrating the partitioning of a design 100 expressed as a netlist, or other software-based circuit representation, as performed by a conventional partitioning tool. The netlist specifies the various logic blocks, or instances, of a design as well as the nets connecting those logic blocks. The netlist does not, however, specify place and route information relating to the routing blocks.

As shown, the design 100 can include a root node 105. The design further specifies four different logic hierarchies corresponding to nodes 110, 115, 120, and 125 respectively. Each logic hierarchy can include further child nodes (not shown). A conventional partitioning tool typically assigns each logic hierarchy to a different IC. In this case, the logic hierarchy represented by node 110 has been assigned to PLD 130, logic hierarchy 115 to PLD 135, logic hierarchy 120 to PLD 140, and logic hierarchy 125 to PLD 145.

Conventional partitioning tools have limitations as to usability and the quality of the solutions that are achieved when partitioning across multiple devices. When partitioning, design constraints must be observed. One such constraint pertains to the number of connections that can be used between partitions, in this case individual PLDs. Specifically, there cannot be more connections among the partitions than the total number of inputs and outputs (I/Os) available on the PLDs concerned. When partitioning a design along logic hierarchy boundaries, as illustrated in FIG. 1, the partitioning often violates this constraint. That is, the partitioning typically requires more I/Os than are available on the devices concerned. Violation of this constraint leads to an infeasible partitioning of the design.

Another limitation of conventional partitioning tools, is that the sub-circuit in each device, i.e. the portion of the design allocated to each individual PLD, must be implemented individually by a physical design tool. That is, a separate netlist must be generated for each sub-circuit. Accordingly, a separate netlist for each sub-circuit in each PLD must be generated and then connected with the other PLDs in the partitioned design through appropriate I/O ports.

As each sub-circuit of the design is handled as a separate circuit, each partition must undergo separate place and route processes. This can take a significant amount of time. In some cases, place and route can take days to complete. Still, place and route of each sub-circuit must be performed before any determination as to validity of the resulting circuit can be determined. No solution exists for validating a partitioned design at an early stage of development.

In cases where no valid solution is found, conventional tools offer the designer no opportunity to analyze the illegal solution to determine a valid solution. The user is unable to modify the illegal solution. Instead, the designer must return to the register transfer level (RTL) stage of development and synthesize a different netlist. Frequently, global timing constraints are violated to such an extent that the resulting partitioned design runs at only several MHz, despite each constituent PLD having the capability of operating at clock speeds of hundreds of MHz.

It would be beneficial to have a tool which can partition a design across more than one device in a manner that overcomes the deficiencies described above.

SUMMARY OF THE INVENTION

The present invention provides a solution for partitioning a design across a plurality of integrated circuits (ICs). One embodiment of the present invention can include a method of partitioning a design across a plurality of ICs using pblocks. In general, a pblock is a software construct, which represents a hierarchical physical instance corresponding to a physical area on an IC of the plurality of ICs. Each pblock can be assigned instances of one or more different logic hierarchies. Within the area defined by a pblock, entire logic hierarchies, or subparts thereof, can be assigned, although pblocks do not alter the logical netlist for a circuit design.

The method, using a computer, can include creating a pblock for each one of the plurality of ICs and assigning a plurality of instances to a selected pblock. Each of the plurality of instances can be from a different logic hierarchy. At least one input/output (I/O) buffer and port can be added automatically to the selected pblock to accommodate the plurality of instances. Nets can be created to connect the plurality of instances and the I/O buffer(s) and port(s) within the selected pblock.

The method further can include assigning at least one other instance, from a same logic hierarchy as one of the plurality of instances, to at least one other pblock and indicating connectivity between the selected pblock and the other pblock(s). By the same token, the method can include removing at least one instance from the selected pblock and selectively removing at least one of an I/O buffer, a port, and a net from the selected pblock according to the removing step. In the case where at least one other instance, from a same logic hierarchy as one of the plurality of instances, is assigned to at least one other pblock, the method can include indicating connectivity between the selected pblock and the at least one other pblock.

The method further can include assigning at least one other instance, from a same logic hierarchy as one of the plurality of instances, to at least one other pblock and determining a number of connections between the selected pblock and the other pblock(s). A determination can be made as to whether the number of connections between the selected pblock and the other pblock(s) exceeds a threshold determined, at least in part, from at least one of a number of inputs or outputs available on the logic devices associated with the selected pblock and the other pblock(s).

One or more additional pblocks can be created for one or more of the plurality of ICs. The selected pblock and the additional pblock(s) can be mutually exclusive from one another or overlap one another. In another embodiment, the additional pblock(s) can be nested within the selected pblock.

Another embodiment of the present invention can include a method of segmenting a design across a plurality of devices including creating a data structure such as pblock for each one of the plurality of devices and assigning at least a first instance from a logic hierarchy to a first data structure. At least a second instance from the logic hierarchy can be assigned to a second data structure. The method further can include automatically adding at least one of an I/O buffer and port to the first and second data structures and creating nets connecting the plurality of instances and the I/O buffer(s) and port(s) within the first and second data structures.

The method also can include determining connectivity between the first and second data structures. The connectivity can be indicated, i.e. graphically, audibly, or through text. The method further can include determining whether a number of connections between the first and second data structures exceeds a threshold determined, at least in part, from at least one of a number of inputs or outputs available on the logic devices associated with the first and second data structures.

Yet another embodiment of the present invention can include a method of partitioning a design across a plurality of ICs. The method can include creating a pblock for each of the plurality of ICs and assigning logic hierarchies to pblocks such that at least one selected logic hierarchy is spread across more than one pblock. For pblocks associated with the selected logic hierarchy or hierarchies as the case may be, I/O buffers and ports can be added to the pblocks and connectivity between the pblocks can be determined.

For pblocks associated with the selected logic hierarchy (ies), nets can be added to the pblocks thereby connecting sub-portions of the logic hierarchies within each pblock. The method further can include providing an indication of the connectivity between the pblocks associated with the selected logic hierarchy(ies). A number of connections between the pblocks associated with the selected logic hierarchy(ies) can be determined.

A determination can be made as to whether the number of connections between the pblocks associated with the selected logic hierarchy(ies) exceeds a threshold. The threshold can be determined, at least in part, from at least one of a number of inputs or outputs available on the ICs corresponding to the pblocks associated with the selected logic hierarchy(ies). An indication can be provided if the number of connections exceeds the threshold.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

The present invention provides methods for partitioning a design across multiple devices. In accordance with the inventive arrangements disclosed herein, logical hierarchies of the design can be subdivided and assigned to various devices. Rather than limit the partitioning process to a one-to-one correspondence between logic hierarchies and devices, logic hierarchies can be subdivided into a plurality of constituent parts or instances. These instances can be assigned to different devices. To avoid violating any constraints with respect to input/output (I/O) among partitions, throughout the partitioning process connectivity among the devices can be monitored.

Figure 1:
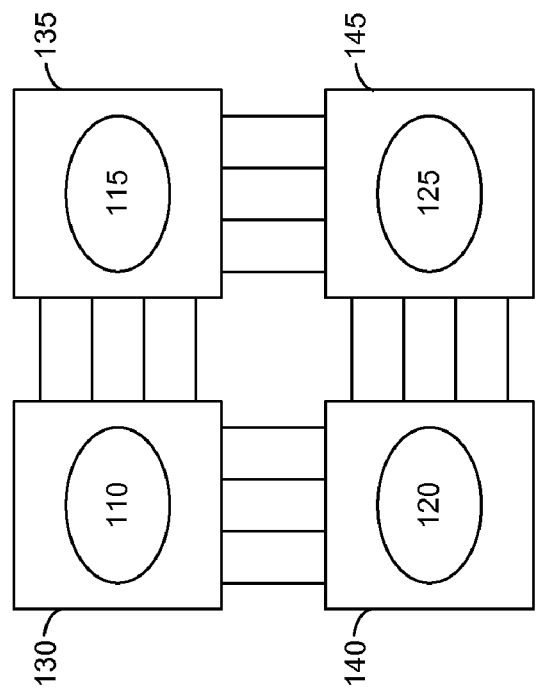
FIG. 1 is a schematic diagram illustrating the partitioning of a design as performed by a conventional partitioning tool.
Figure 1:
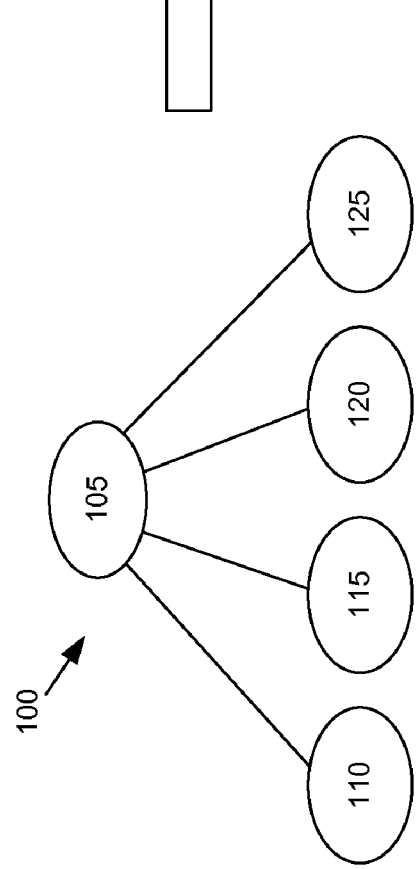
Figure 2:
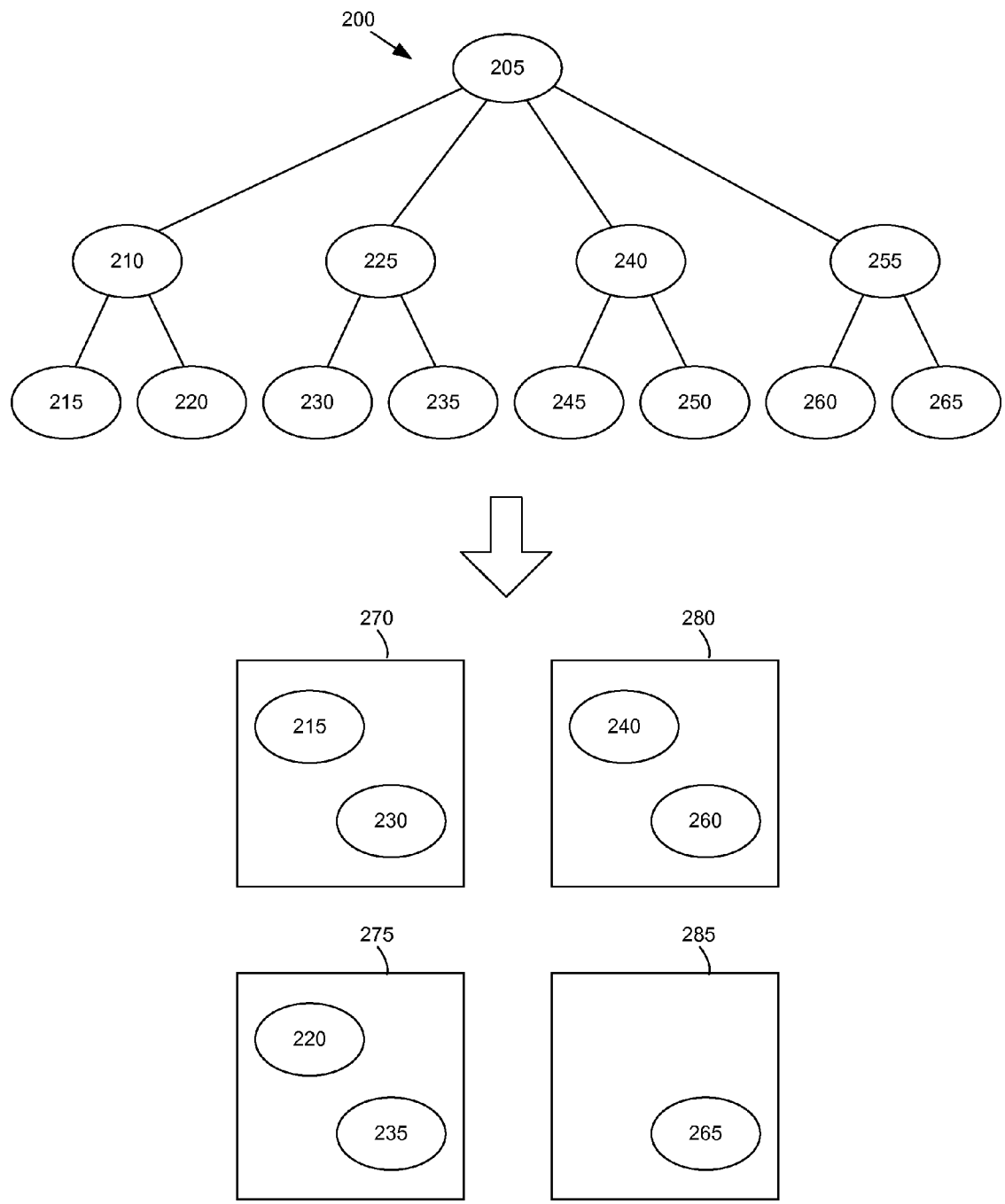
FIG. 2 is a schematic diagram illustrating the partitioning of a design in accordance with one embodiment of the present invention.

FIG. 2 is a schematic diagram illustrating the partitioning of a design 200 in accordance with one embodiment of the present invention. The design 200 can be specified as a netlist or other software-based circuit representation in which logical components and connectivity are specified. The netlist, however, does not specify physical location of components on a device or the physical wiring connections, or nets, used to connect the components.

The size of the design 200 can be such that it must be partitioned across more than one integrated circuit (IC). That is, the design 200 is too large to be implemented on a single device. Thus, for purposes of illustration only, the design 200 is to be partitioned across four ICs 270, 275, 280, and 285. In one embodiment, the ICs 270-285 can be implemented as programmable logic devices (PLDs), for example, field programmable gate arrays (FPGAs) and/or complex programmable logic devices (CPLDs). In other embodiments, the ICs can be implemented as application specific integrated circuits (ASICs), application specific standard products (ASSPs), or the like. In any case, the ICs 270-285 can be located upon one or more circuit boards, located on a same die, or communicatively linked in some other fashion.

As shown, the design 200 can include a root node 205. The root node 205 has four child nodes 210, 225, 240, and 255. Each of the child nodes 210, 225, 240, and 255 represents the top level of a logic hierarchy. As noted, a top level of a logic hierarchy can represent components such as a microprocessor, an MP3 player, or some other functional grouping of components. Each top level node 210, 225, 240, and 255 can have child nodes representing constituent logic components, or instances of logic components (hereafter "instances"), of the logic hierarchy. Thus, node 210 has child nodes 215 and 220. Node 225 has child nodes 230 and 235. Node 240 has child nodes 245 and 250, and node 255 has child nodes 260 and 265.

To better illustrate the design 200, if top level node 210 represents a microprocessor, then the child nodes 215 and 220 may represent, for example, Arithmetic Logic Units (ALUs). A further breakdown of the logic hierarchy represented by node 210 can continue with additional levels representing the constituent components of the ALUs (not shown). The logic hierarchy can continue branching down with increasing specificity until the lowest level component parts of the logic hierarchy are specified as the leaves of the branch.

The design can be loaded into a software-based circuit design tool executing within a computer system. The design tool can be configured to perform partitioning and, more particularly, partitioning of a design across more than one IC. In one embodiment, the design tool can be implemented as the PlanAhead Hierarchical Floorplanner (PlanAhead) available from Xilinx, Inc. of San Jose, Calif. PlanAhead provides hierarchical, block-based, modular, and incremental design functions. The incremental design functionality of the tool can lock portions the placement of a design, thereby allowing the place and route functions of the tool to focus only on logic blocks that have changed. This can significantly reduce the time needed for physical design. Generally, the number of design iterations necessary, as well as the time needed to perform each iteration, can be reduced.

Conventional design tools select the different logic hierarchies identified in a netlist and typically assign one logic hierarchy to each IC. Common practice would attempt to partition the design 200 along these logic hierarchy boundaries. In accordance with the inventive arrangements disclosed herein, the design 200 can be processed such that different instances of the different logic hierarchies 210, 225, 240, and 255 are assigned to different ones of the ICs. Thus, subparts of each logic hierarchy can be assigned individually to different ones of the ICs regardless of the particular logic hierarchy to which each instance belongs.

Accordingly, with reference to FIG. 2, nodes 215 and 230 can be assigned to IC 270. Despite nodes 215 and 230 representing instances from two different logic hierarchies, each is assigned to a same IC. Similarly, nodes 220 and 235 have been assigned to IC 275. IC 280 includes nodes 240 and 260, while IC 285 includes node 265. IC 280 illustrates that instances from different levels of logic hierarchies can be included in a same IC. In general, the design tool can partition the design 200 such that instances from a same logic hierarchy are assigned to different ICs and instances from two or more different logic hierarchies are assigned to a same IC.

Some embodiments of the present invention facilitate partitioning through the use of pblocks. A pblock is a software construct, such as a data structure, which represents a physical area of a device. More particularly, a pblock represents a hierarchical physical instance corresponding to a defined area on a device. Each pblock can be assigned instances of one or more different logic hierarchies. Within the area defined by a pblock, entire logic hierarchies, or subparts thereof, can be assigned. Each pblock, once created, can be allocated, or assigned, to a particular device. Further, each pblock can be annotated, using the design tool, with one or more design constraints which remain associated with the pblock for testing purposes. Pblocks do not alter the logic hierarchy or logical netlist.

According to one embodiment, one pblock can be created for each device of a multi-device circuit. Thus, in reference to FIG. 2, a pblock can be created and assigned to each device 270-285. Rather than assign instances directly to devices, each instance can be assigned to a pblock. This allows the pblocks themselves to be moved and/or relocated from one IC to another, without having to redefine the logic components or interconnections defined therein. Further, pblocks can be locked, such that the design tool can process other unlocked portions of the circuit design.

In another embodiment, more than one pblock can be assigned to each device. In that case, each pblock can occupy an area that is mutually exclusive of the other. Still, pblocks can be nested such that one pblock can be entirely contained within another pblock or merely overlap another pblock. If the pblocks are not mutually exclusive, each will share physical resources with the other nested or overlapping pblock.

In any case, FIG. 2 illustrates the case where a pblock has been created for each IC in one embodiment of the invention. Having created and assigned the pblocks, instances from the logic hierarchies can be assigned to the pblocks. As instances are added, the design tool can graphically represent the connectivity among the various pblocks. In one embodiment, one or more lines can be drawn between pblocks that must communicate with one another as determined by the particular instances assigned to each pblock. That is, pblocks that include instances from a same logic hierarchy will need to communicate with one another and, therefore, must be connected. Line thickness, line color, or the number of lines drawn can indicate, directly or indirectly, the degree of connectivity, or number of connections, between the pblocks.

Figure 3:
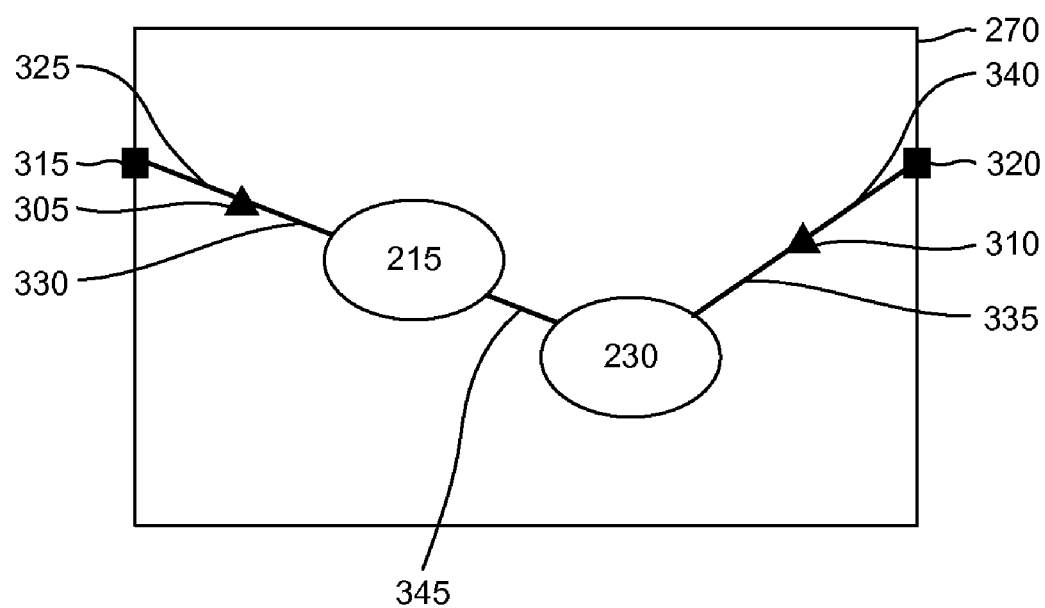
FIG. 3 is a schematic diagram illustrating the inclusion of input/output buffers and ports in accordance with the inventive arrangements disclosed herein.

FIG. 3 is a schematic diagram illustrating the inclusion of I/O buffers and ports in accordance with the inventive arrangements disclosed herein. The pblock assigned to IC 270 is shown. In addition to instances 215 and 230, the pblock includes I/O buffers 305 and 310. Ports 315 and 320 also have been included. As instances are added to a pblock, I/O buffers and ports can be added according to the instances that have been added. A one-to-one correspondence can exist between ports and I/O buffers. I/O buffers and ports also can be removed based upon the removal of any instances. The creation, or inclusion, of I/O buffers and ports, as well as the removal of such components, can be performed automatically by the design tool or manually by a user acting through a design tool as the user adds or removes instances from pblocks.

In general, when an instance is assigned to a target pblock, each pin of the instance is identified. For each pin of the instance, all of the nets connected to the pins are identified. For all of the instances connected to each net, the pblocks containing the visited instance(s) are noted. If instances on a net currently being evaluated span more than one pblock, a buffer can be inserted for each pblock. The net can be rebuilt to incorporate the inserted buffer. Each new buffer can be marked as being "auto-inserted".

The placement of auto-inserted buffers can be performed manually by the user acting through a design tool, by leaving a portion of the circuit design unplaced and exporting that portion to a place and route tool that automatically places the buffers, or by including a global routing module within the design tool to automatically place the buffers. In any case, the placement of buffers can be driven by cost considerations such as: (1) minimal routing wire length considering the relative positions of devices; (2) global routing congestion; and (3) timing where buffers along timing critical paths are given top placement priority. Still, it should be appreciated that the examples described herein are not intended to limit the scope of the present invention as other cost considerations can be taken into account.

With regard to the removal of a buffer, when an instance is removed from a target pblock, each pin of the instance can be identified. The nets connected to each pin also can be identified. For all instances connected to the nets, the pblocks containing the visited instances can be noted. If no other instances still are contained by the target pblock, the auto-inserted buffer for the target pblock can be removed. If, however, all other instances are contained by a single pblock, the auto-inserted buffer for that pblock can be removed. The net can be rebuilt to reflect the removed buffers.

The ports 315 and 320 are software constructs representing "imaginary boundary pins" on a net. That is, ports 315 and 320 indicate locations on nets and do not correspond to, or indicate, physical ports or pins on the IC. Rather, each port indicates the location of the boundary of the pblock passing through a net in which the pblock port is located. The ports help maintain a complete, physical hierarchy. This hierarchy maintains the same functionality and connectivity defined in the original logical netlist or logical hierarchy. Each port 315 and 320 can link to a net or other conductor external to the pblock and a net internal to the pblock, thereby helping to encapsulate the pblock as a standalone portion of the circuit design, i.e., a sub-circuit.

In addition to adding the I/O buffers 305 and 310 and the ports 315 and 320, the design tool also can create nets connecting the instances that have been added to the pblock. Nets can be automatically modified, added, or removed, by the design tool based upon the addition or removal of instances to and from the pblock. Thus, as shown, new physical nets 325, 330, 335, 340, and 345 can be created to reflect the physical connectivity between instances 215 and 230 with other portions of the netlist, newly created I/O buffers 305 and 310, and newly created ports 315 and 320.

Accordingly, the effect of adding or removing an instance can be evaluated with respect to I/O feasibility dynamically as a designer continues to add or remove instances from pblocks. Generally, the design tool can process only those portions of the design that change, as it changes, to increase processing speed and efficiency.

As noted, when partitioning a design across multiple ICs, there cannot be more connections among the partitions than the total number of I/Os on the ICs concerned. By automatically adding or removing I/O buffers, ports, and/or nets as instances are added or removed, the design tool can provide designers with an indication of connectivity among pblocks of the design. Further, as the number of I/Os available from the devices to be used in the design is known, the design tool can determine whether constraints pertaining to connectivity among partitions, or devices, likely will be violated. This allows a designer to avoid configurations that, more than likely, will result in an infeasible partitioning.

A designer can add and remove instances from pblocks as needed until a feasible partitioning is achieved. Once the various pblocks are configured, each can be treated as if it were a standalone design. The netlist and constraints relating to each pblock can be independently exported to be passed along to another design tool such as a place and route tool.

Figure 4:
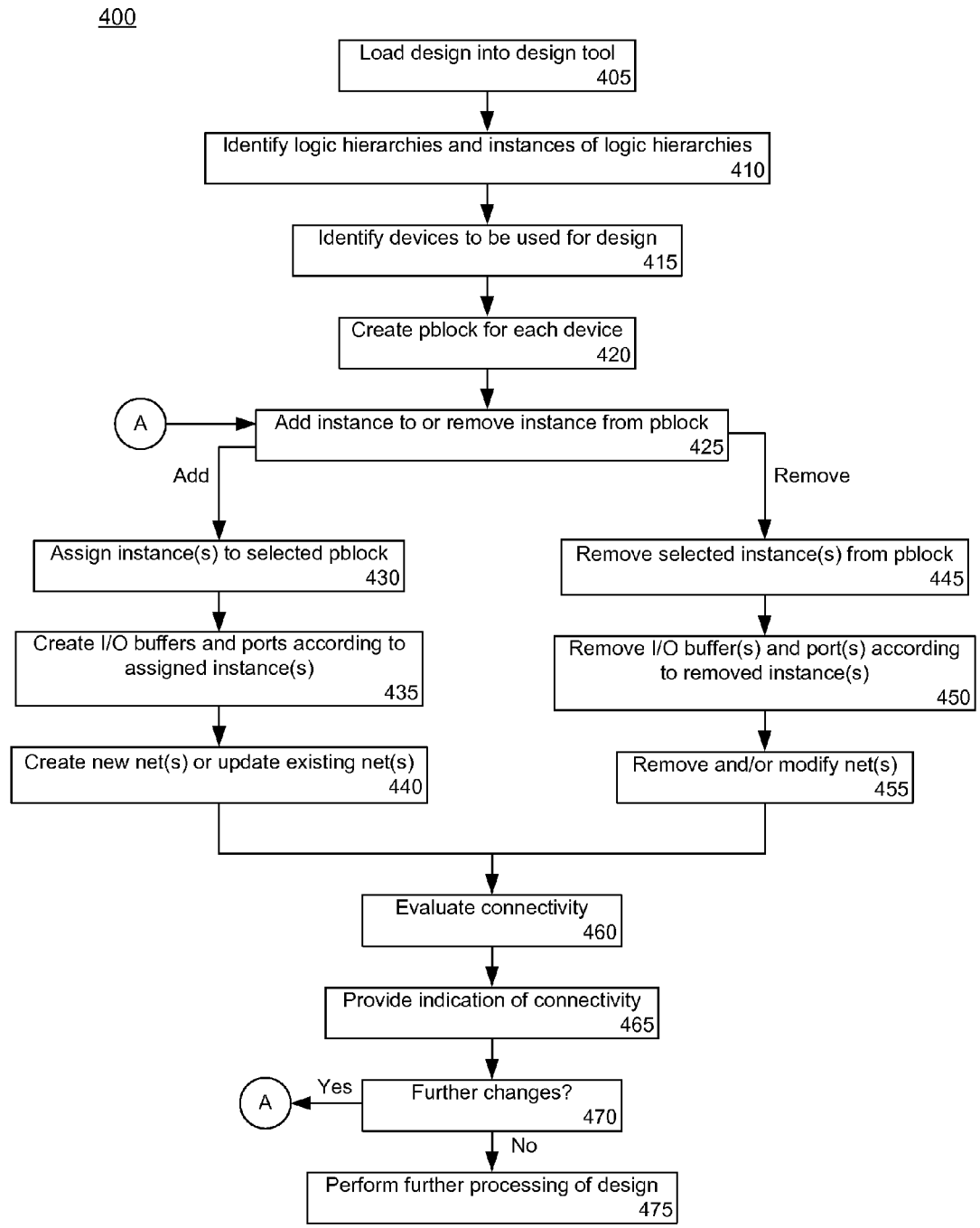
FIG. 4 is a flow chart illustrating a method of partitioning across a plurality of devices in accordance with the inventive arrangements disclosed herein.

FIG. 4 is a flow chart illustrating a method 400 of partitioning across a plurality of devices in accordance with the inventive arrangements disclosed herein. The method 400 can begin in a state where a design, which is too large to fit on a single device, must be partitioned across more than one device. Accordingly, the method can begin in step 405, where the design is loaded into a design tool capable of partitioning the design. As noted, the design can be specified as a netlist or other software object.

In step 410, logic hierarchies specified in the design can be identified as well as any instances within the logic hierarchies. An instance can refer to a sub-portion of a logic hierarchy, as represented by a node in a hierarchical graph view, such as the one depicted with reference to FIG. 2. In step 415, the particular devices over which the design will be partitioned can be identified. Within the design tool, a designer can specify the type of devices to be used as well as the particular model of each device.

In step 420, the design tool can create a pblock for each device. While more than one pblock can be created for a given device, for purposes of illustration, one pblock can be assigned to each device. Notwithstanding, if more than one pblock is assigned to a single device, the pblocks can be nested entirely within one another, placed in a mutually exclusive manner such that no overlapping with another pblock occurs, or placed in such as way as to overlap with one another.

In step 425, a determination can be made as to whether one or more instances of a logic hierarchy are to be added to, or removed from, a pblock. A designer can request either action through a graphical user interface (GUI) or using some other means for data entry. If an instance is to be added, the method can proceed to step 430. If an instance is to be removed, the method can continue to step 445.

Continuing with step 430, in the case where an instance is to be added, one or more instances can be assigned to a selected pblock. More particularly, a user can select an instance at any level of the logic hierarchy. In one embodiment, selection of a particular node or instance can automatically select all child nodes or instances of the selected node. In another embodiment, individual instances can be selected. Once the instances are selected, a pblock can be selected. The design tool then can create an association between the selected instance(s) and the selected pblocks. As noted, instances from two or more different logic hierarchies can be assigned to a same pblock. Also, instances from a same logic hierarchy can be assigned to two or more different pblocks.

In step 435, as each instance is associated or assigned to a pblock, the design tool can automatically create I/O buffers and pblock ports for the added instance(s). The number of I/O buffers and pblock ports can depend upon the connectivity required by the instance(s) added. That is, if the instance can share an I/O buffer and port already present, new structures need not be created. If additional I/O buffers and ports are required, then such structures can be added.

In step 440, new nets can be created automatically to connect the instances within the pblock with one another and with the I/O buffers and ports. If possible, the design tool can update or modify existing nets as instances are assigned to the pblock. After step 440, the method can proceed to step 460.

Continuing with step 445, in the case where one or more selected instances are to be removed from a selected pblock, those instances can be removed. In step 450, any I/O buffers and ports in the pblock which were associated with the removed instance(s) and which are no longer needed can be removed from the pblock. In step 455, any existing nets within the pblock that are no longer needed once the instance (s), I/O buffers, and ports have been removed or disassociated from the pblock also can be removed. Alternatively, the design tool can modify existing nets based upon the instances, I/O buffers, and ports remaining in the pblock. After step 455, the method can proceed to step 460.

In step 460, the design tool can evaluate connectivity among each of the pblocks. Connectivity can be evaluated to determine whether sufficient resources, such as wires and I/O pins of each IC, exist to support the signals that must be exchanged between devices, or pblocks, in the design. That is, there must be enough output pins for sending signals and enough input pins for receiving signals on each device in the design. Pins that can be selectively configured as either inputs or outputs, referred to as tristate pins, can be considered either inputs or outputs depending upon the connectivity requirements.

In step 465, the design tool can provide an indication of the connectivity. Such information can be presented graphically or as raw data, for example as listed in a table. According to another embodiment, connectivity from one pblock to another can be illustrated using one or more lines graphically linking the pblocks. The number of lines shown can be proportional to the number of connections between various pblocks and further can indicate signal direction. Alternatively, a single line can be used where the color and/or thickness of the line indicates the number of connections. In that case, particular colors can represent states where the number of connections is likely to exceed the available input or output pins as the case may be. Notwithstanding, text information also can be displayed providing more exact or specific information.

Accordingly, if the number of inputs needed for a device exceeds the available input pins on the device, such a condition can be indicated. Similarly, if a number of outputs needed for a device exceeds the available output pins on that device, that condition also can be indicated. If a design constraint likely will be violated by the current partitioning, i.e. the number of connections between pblocks is greater than the available I/Os of the devices, the designer can be warned or notified, for example through a visual indicator or an audible queue.

In step 470, if the designer wishes to make further changes to the partitioning, the method can loop back to step 425 to repeat as may be required. If no further changes are needed, the method can proceed to step 475 to perform further processing of the design. As noted, individual ones of the pblocks can be exported to be processed individually, if desired, by a place and route tool. Alternatively, a designer can continue modifying pblocks on an individual basis. In that case, further pblocks can be created and assigned to a given device as discussed to create a hierarchy of pblocks, each with a corresponding set of constraints if so desired.

It should be appreciated that the various examples described herein have been provided for purposes of illustration only and, as such, are not intended to limit the scope of the present invention. For example, selected steps of the method can be performed in varying order without departing from the spirit of the invention. Additionally, the description of adding and removing instances is not intended to preclude actions such as transferring an instance from one pblock to another, particularly as such an action involves both removing and adding operations.

The present invention provides a solution for partitioning a design across multiple devices. In accordance with the inventive arrangements disclosed herein, each device can be associated with one or more pblocks. As instances are assigned to pblocks of different devices, structures such as I/O buffers, ports, and nets can be automatically created. Accordingly, the design tool can provide, to the designer, feedback pertaining to connectivity among each IC as instances are added to each pblock. This feedback can indicate whether various design constraints, particularly those pertaining to connectivity among the multiple devices, likely will be violated.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program, software application, and/or any variants thereof, in the present context, mean any expression, in any language, code or notation, of a set of instructions intended to cause a system having an information processing capability to perform a particular function either directly or after either or both of the following: a) conversion to another language, code, or notation; or b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of segmenting a design across a plurality of integrated circuits (ICs), said method comprising:

creating, using a computer, a data structure representing a physical area of an IC of the plurality of ICs for each one of the plurality of ICs;

assigning at least a first instance from a logic hierarchy of the design to a first data structure corresponding to a first IC of the plurality of ICs;

assigning at least a second instance from the logic hierarchy of the design to a second data structure corresponding to a second IC of the plurality of ICs;

automatically adding at least one of an input/output buffer and port to the first and second data structures; and creating nets connecting the plurality of instances and the input/output buffer and port within the first and second data structures.

2. The method of claim 1, further comprising determining connectivity between the first and second data structures.

3. The method of claim 1, further comprising indicating connectivity between the first and second data structures.

4. The method of claim 1, further comprising determining whether a number of connections between the first and second data structures exceeds a threshold determined, at least in part, from at least one of a number of inputs or outputs available on the first and second ICs associated with the first and second data structures.

5. The method of claim 4, further comprising providing an indication that the threshold was exceeded if the number of connections exceeds the threshold.

6. The method of claim 1, wherein the data structure is a pblock which corresponds to a physical area on the IC.

* * * * *